US006525803B2

(12) United States Patent
Kwan et al.

(10) Patent No.: US 6,525,803 B2
(45) Date of Patent: Feb. 25, 2003

(54) BALANCED POSITIONING SYSTEM FOR USE IN LITHOGRAPHIC APPARATUS

(75) Inventors: Yim Bun P. Kwan, Eindhoven (NL); Wilhelmus J. T. P. van de Wiel, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 37 days.

(21) Appl. No.: 09/739,097

(22) Filed: Dec. 19, 2000

(65) Prior Publication Data

US 2001/0006762 A1 Jul. 5, 2001

(30) Foreign Application Priority Data

Dec. 21, 1999 (EP) .............................. 99310324
Dec. 21, 1999 (EP) .............................. 99310371

(51) Int. Cl.[7] .................. G03B 27/42; G03B 27/58; H01L 21/27
(52) U.S. Cl. .................. 355/53; 355/72; 318/649
(58) Field of Search .................. 355/53, 72, 75; 310/12; 318/568.16, 625, 649, 566; 248/638

(56) References Cited

U.S. PATENT DOCUMENTS

| 5,208,497 | A |   | 5/1993  | Ishii et al. |
| 5,477,304 | A | * | 12/1995 | Nishi ............................ 355/50 |
| 5,537,186 | A | * | 7/1996  | Korenaga et al. ............. 355/53 |
| 5,815,246 | A |   | 9/1998  | Sperling et al. |
| 5,982,128 | A | * | 11/1999 | Lee ........................ 318/568.16 |
| 6,028,376 | A | * | 2/2000  | Osanai et al. ................. 310/12 |
| 6,246,204 | B1 |  | 6/2001  | Ebihara et al. |
| 6,252,370 | B1 |  | 6/2001  | Ebihara et al. |
| 6,255,795 | B1 |  | 7/2001  | Ebihara et al. |
| 6,255,796 | B1 |  | 7/2001  | Ebihara et al. |
| 6,262,796 | B1 | * | 7/2001  | Loopstra et al. .............. 355/53 |
| 6,323,935 | B1 |  | 11/2001 | Ebihara et al. |
| 6,329,780 | B1 |  | 12/2001 | Ebihara et al. |
| 6,337,484 | B1 | * | 1/2002  | Loopstra et al. ....... 250/442.11 |

FOREIGN PATENT DOCUMENTS

GB 2299867 * 10/1996

OTHER PUBLICATIONS

Thomas W. Novak, A New VLSI Printer, SPIE vol. 135 Developments in Semiconductor Microlithography, III, 1978, 36–44.

* cited by examiner

Primary Examiner—Alan A. Mathews
(74) Attorney, Agent, or Firm—Pillsbury Winthrop LLP

(57) ABSTRACT

A balanced positioning apparatus comprises a balance mass which is supported so as to be moveable in the three degrees of freedom, such as X and Y translations and rotation about the Z-axis. Drive forces in these degrees of freedom act directly between the positioning body and the balance mass. Reaction forces arising from positioning movements result in corresponding movement of the balance mass and all reaction forces are kept within the balanced positioning system. The balance mass may be a rectangular balance frame having the stators of two linear motors forming the uprights of an H-drive mounted on opposite sides. The cross-piece of the H-drive spans the frame and the positioned object is positioned within the central opening of the frame.

30 Claims, 6 Drawing Sheets

BALANCED POSITIONING SYSTEM FOR USE IN LITHOGRAPHIC APPARATUS

BACKGROUND OF THE INVENTION

1. Field of the Invention

The present invention relates to balanced positioning systems, such as may be used to position a moveable object in at least three degrees of freedom. More particularly, the invention relates to the use of such a balanced positioning system in lithographic projection apparatus comprising:

an illumination system for supplying a projection beam of radiation;

a first object table for holding patterning means capable of patterning the projection beam according to a desired pattern;

a second object table for holding a substrate; and a projection system for imaging the patterned beam onto a target portion of the substrate.

2. Description of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

- A mask held by said first object table. The concept of a mask is well known in lithography, and its includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to the pattern on the mask. The first object table ensures that the mask can be held at a desired position in the incoming projection beam, and that it can be moved relative to the beam if so desired.
- A programmable mirror array held by a structure, which is referred to as first object table. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- A programmable LCD array, held by a structure which is referred to as first object table. An example of such a construction is given in U.S. Pat. No. 5,229,872, which is incorporated herein by reference.

For purposes of simplicity, the rest of this text may, at certain locations, specifically direct itself to examples involving a mask; however, the general principles discussed in such instances should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". In addition, the first and second object table may be referred to as the "mask table" and the "substrate table", respectively.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) that has been coated with a layer of radiationsensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In general, apparatus of this type contained a single first object (mask) table and a single second object (substrate) table. However, machines are becoming available in which there are at least two independently movable substrate tables; see, for example, the multi-stage apparatus described in U.S. Pat. No. 5,969,441 and U.S. Ser. No. 09/180,011, filed Feb. 27, 1998 (WO 98/40791), incorporated herein by reference. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughout, which in turn improves the cost of ownership of the machine.

In a known lithographic apparatus, the drive unit of the positioning device for the substrate table comprises two linear Y-motors each of which comprises a stator extending parallel to the Y-direction and secured to a base of the positioning device, and a translator (Y-slider) movable along the stator. The base is secured to the frame of the lithographic device. The drive unit further comprises a linear X-motor that comprises a stator extending parallel to the X-direction and a translator (X-slider) which can be moved along the stator. The stator of the X-motor is mounted on an X-beam that is secured, near its respective ends, to the translators (Y-sliders) of the linear Y-motors. The arrangement is therefore H-shaped, with the two Y-motors forming the uprights and the X-motor forming the cross-piece, and this arrangement is often referred to as an H-drive.

The driven object, in this case the substrate table, can be provided with a so-called air foot. The air foot comprises a gas bearing by means of which the substrate table is guided so as to be movable over a guide surface of the base extending at right angles to the Z-direction.

In a lithographic apparatus, reactions on the machine frame to acceleration forces used to position the mask (reticle) and substrate (wafer) to nanometer accuracies are a major cause of vibration, impairing the accuracy of the apparatus. To minimize the effects of vibrations it is possible to provide an isolated metrology frame, on which all position sensing devices are mounted, and to channel all reaction forces to a so-called force or reaction frame that is separated from the remainder of the apparatus.

In an alternative arrangement, the reaction to the driving force is channeled to a balance mass, which is normally heavier than the driven mass which is free to move relative to the remainder of the apparatus. The reaction force is spent in accelerating the balance mass and does not significantly affect the remainder of the apparatus. Balance masses moveable in three degrees of freedom in a plane are described in WO 98/40791 and WO 98/28665 (mentioned above), as well as U.S. Pat. No. 5,815,246.

EP-A-0,557,100 describes a system which relies on actively driving two masses in opposite directions so that the reaction forces are equal and opposite and so cancel out. The system described operates in two dimensions but the active positioning of the balance mass necessitates a second positioning system of equal quality and capability to that driving the primary object.

SUMMARY OF THE INVENTION

An object of the present invention is to provide a balancing system that is readily extendable to multiple degrees of freedom and is usable with various different drive mechanisms.

According to the present invention there is provided a lithographic projection apparatus comprising:
  an illumination system for supplying a projection beam of radiation;
  a first object table for holding patterning means capable of patterning the projection beam according to a desired pattern;
  a second object table for holding a substrate; and
  a projection system for imaging the patterned beam onto a target portion of the substrate; and
  a balanced positioning system capable of positioning at least one of said object tables in more than three degrees of freedom, the positioning system comprising:
    at least one balance mass;
    bearing means for movably supporting said balance mass;
    coarse positioning means for positioning said object table in first to third degrees of freedom, said three degrees of freedom being translation in first and second directions and rotation about a third direction, said first, second and third directions being substantially mutually orthogonal; and
    fine positioning means for positioning said object table in at least a fourth degree of freedom substantially orthogonal to said first, second and third degrees of freedom, said coarse and fine positioning means being arranged so that reaction forces from said coarse and fine positioning means are channeled to said balance mass; characterized in that:
    said balance mass is supported by said bearing means so as to be substantially free to move in at least said fourth degree of freedom.

The long stroke (coarse) positioning system of a lithography apparatus is normally arranged to position the apparatus in X, Y and Rz degrees of freedom whilst a short stroke (fine) positioning system provides higher-precision positioning over all 6 degrees of freedom (i.e. X, Y, Z, Rz, Ry, and Rx). The positioning movements of the short stroke positioning system can be a source of undesirable vibrations in the apparatus. These movements are often of much higher frequency than movements of the long stroke positioning system and can involve high accelerations so that the reaction forces are large, even though the moving mass is smaller. By arranging for the reaction forces of the fine positioning means to be channeled to the balance mass, which is free to move in at least one additional degree of freedom, directly or via the coarse positioning means, the present invention ensures that all reaction forces are confined to the balanced positioning system and vibrations in the remainder of the apparatus are minimized.

The balance mass may be a single body moveable in at least four degrees of freedom or may be made up of several parts separately moveable in one or more degrees of freedom. For example, in an embodiment of the invention a first part of the balance mass is a frame moveable in the first to third degrees of freedom (e.g. X, Y and $R_z$) and surrounding the object table whilst a second part of the balance mass is disposed underneath the object table and is moveable in at least the fourth degree of freedom (e.g. Z).

According to a further aspect of the present invention there is provided a lithographic projection apparatus comprising:
  an illumination system for supplying a projection beam of radiation;
  a first object table for holding patterning means capable of patterning the projection beam according to a desired pattern;
  a second object table for holding a substrate; and
  a projection system for imaging the patterned beam onto a target portion of the substrate; and
  a balanced positioning system capable of positioning at least on of said object tables in at least three degrees of freedom, the positioning system comprising:
    at least one balance mass;
    bearing means for supporting said balance mass so as to be substantially free to move in said three degrees of freedom; and
    driving means for acting directly between said object table and said balance mass to position said object table in said three degrees of freedom; characterized in that:
    said balance mass comprises a generally rectangular frame having its sides generally parallel to said first and second directions, and a central opening in which said object table is at least partly disposed.

With the balance mass in the form of a rectangular frame, the drives forming the uprights of a so-called H-drive arrangement can easily be integrated into the sides of the frame ensuring that the reaction forces all act directly between balance mass and driven object table. Also, because the driven object table sits within the central opening of the balance frame the distance in the Z-direction between the centers of gravity of the balance frame and the driven mass is reduced.

To reduce the excursions of the balance mass, and hence the overall footprint of the apparatus, it is preferred that the balance mass is considerably more massive, preferably at least five times, than the positioned object. In this regard, all masses that move with the balance mass are considered part of it and all masses that move with the positioned object are considered part of that.

It should be noted that in embodiments of the invention according to either of the aspects described above, multiple object (mask or substrate) tables may be provided and the reaction forces to the drive forces of two or more tables may be directed to a common balance mass or masses.

According to yet a further aspect of the present invention there is provided a lithographic projection apparatus comprising:

an illumination system for supplying a projection beam of radiation;

a first object table for holding patterning means capable of patterning the projection beam according to a desired pattern;

a second object table for holding a substrate; and a projection system for imaging the patterned beam onto a target portion of the substrate; and a balanced positioning system capable of positioning at least on of said object tables in at least two degrees of freedom, the positioning system comprising:

at least one balance mass;

bearing means for movably supporting said balance mass;

positioning means for positioning said object table in at least first and second degrees of freedom, said first to second degrees of freedom being translations in first and second directions that are substantially orthogonal, said positioning means comprising coarse and fine positioning means and being arranged so that reaction forces from said positioning means are channeled to said balance mass; characterized in that:

said coarse positioning means comprises a planar electric motor having a translator mounted to said object table and a stator extending parallel to said first and second directions and mounted to said balance mass.

The forces exerted by the planar motor will be channeled directly to the balance mass in the first and the second direction as opposed to an H-drive arrangement. In an H-drive arrangement forces may be channeled indirectly to the balance mass, since the object table is driven by an X-slider over an X-beam in the X-direction and the X-beam and object table are driven in the Y-direction by two Y-direction linear motors with corresponding sliders mounted to both ends of the X-beam. Only the beams of the Y-linear motors are mounted to the balance mass. Forces exerted in the X-direction by the X-motor will be channeled indirectly via the X-beam and the Y-direction linear motors to the balance mass. When a planar motor is used reaction forces in both the X-direction and the Y-direction are directly channeled to the balance mass. Further, with the stator (e.g. a magnet array) mounted to the balance mass, the mass of the balance mass is desirably increased to reduce its movement range.

In a vacuum environment it may be advantageous to use the planar motor also to levitate the object table because it will be difficult to use a gas bearing to levitate the object table in a vacuum environment. The planar motor may also be used to rotate the object table around a third direction being mutually orthogonal to said first and second direction.

The magnate levitation of the planar motor provides for a frictionless bearing allowing the balance mass to, freely move in first and second directions and rotate around the third direction. The balance mass may also be movable in the third direction and/or rotatable around one or both of the first and second directions such that it provides balancing in more than three degrees of freedom. For this purpose the balance mass may be supported by supports having a low stiffness in the third direction. The balance mass may be provided with upstanding walls to raise the center of gravity of the balance mass to the same level in the third direction as the center of gravity of the object table.

According to a further aspect of the invention there is provided a method of manufacturing a device using a lithographic projection apparatus comprising:

an illumination system for supplying a projection beam of radiation;

a first object table for holding patterning means capable of patterning the projection beam according to a desired pattern;

a second object table for holding a substrate; and a projection system for imaging the patterned beam onto a target portion of the substrate; the method comprising the steps of:

providing a substrate provided with a radiation-sensitive layer to said second object table;

providing a projection beam of radiation using an illumination system;

using patterning means to endow the projection beam with a pattern in its cross-section;

projecting the patterned beam of radiation onto target portions of said substrate;

wherein during or prior to said projecting step at least one of said object tables is moved in first to third degrees of freedom by coarse positioning means and in at least a fourth degree of freedom by fine positioning means and, during such movement, reaction forces in said first to third degrees of freedom are exerted on a balance mass;

characterized by the further step of:

channeling reaction forces in said fourth degree of freedom to said balance mass.

In a manufacturing process using a lithographic projection apparatus according to the invention a pattern (e.g. in a mask) is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area" or "target portion", respectively.

In the present document, the terms illumination radiation and illumination beam are used to encompass all types of electromagnetic radiation or particle flux, including, but not limited to, ultraviolet radiation (e.g. at a wavelength of 365 nm, 248 nm, 193 nm, 157 nm or 126 nm), EUV, X-rays, electrons and ions.

The invention is described below with reference to an orthogonal reference system based on X, Y and Z-axes. The Z direction may be referred to as vertical but this should not, unless the context demands, be taken as implying any necessary orientation of the device.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE EMBODIMENT

Embodiment 1

Figure 1:
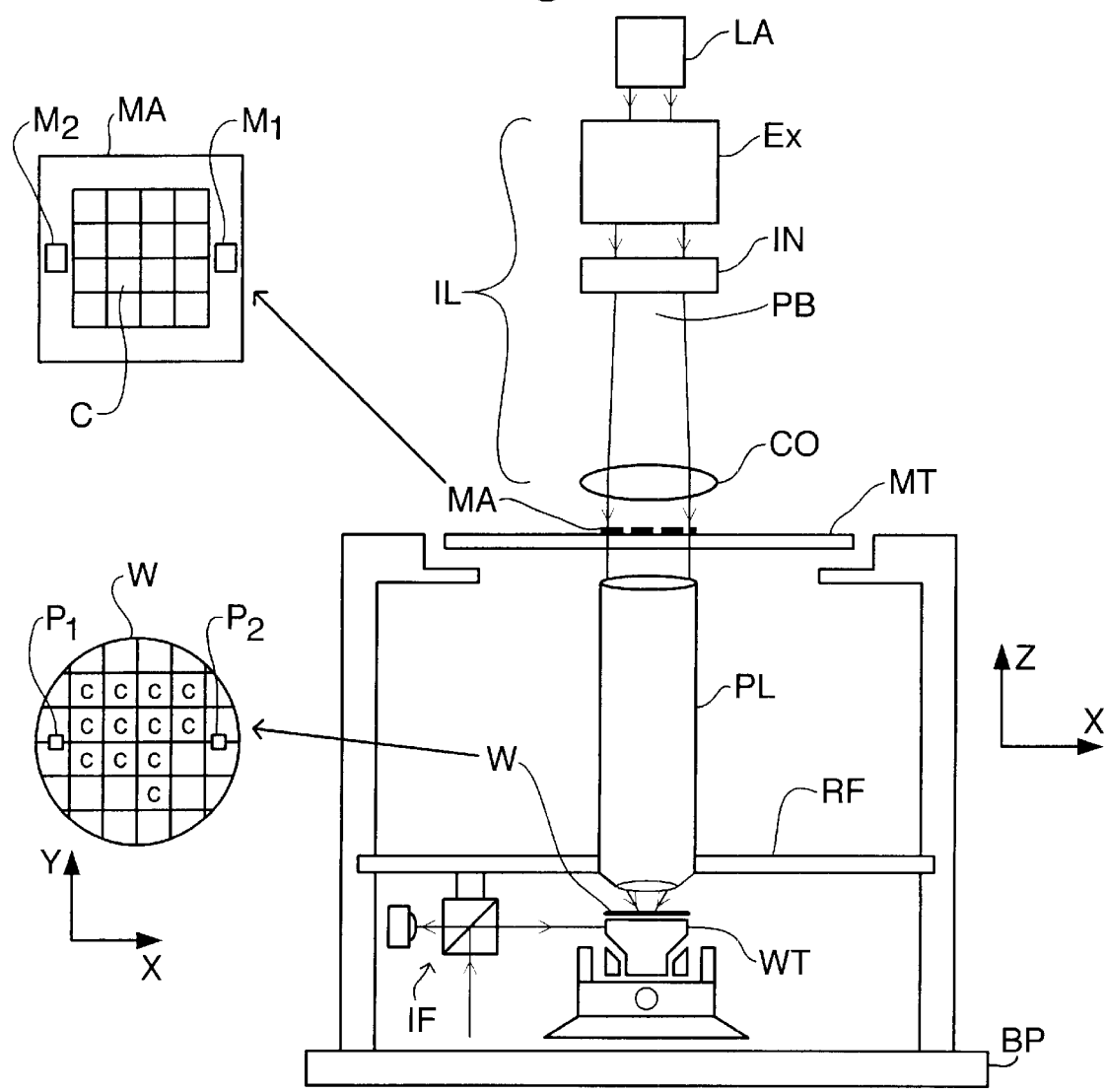
FIG. 1 depicts a lithographic projection apparatus according to a first embodiment of the invention.

FIG. 1 schematically depicts a lithographic projection apparatus according to the invention. The apparatus comprises:

a radiation system LA, IL for supplying a projection beam PB of radiation (e.g. UV or EUV radiation, x-rays, electrons or ions);

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C of the substrate W.

As here depicted, the apparatus is of a transmissive type (i.e. has a transmissive mask). However, in general, it may also be of a reflective type, for example.

The radiation system comprises a source LA (e.g. a Hg lamp, excimer laser, a discharge plasma source, a laser-produced plasma source, an undulator provided around the path of an electron beam in a storage ring or synchrotron, or an electron or ion beam source) which produces a beam of radiation. This beam is passed along various optical components comprised in the illumination system IL,—e.g. beam shaping optics Ex, an integrator IN and a condenser CO—so that the resultant beam PB has a desired form and intensity distribution.

The beam PB subsequently intercepts the mask MA which is held in a mask holder on a mask table MT. Having passed through the mask MA, the beam PB passes through the lens PL, which focuses the beam PB onto a target portion C of the substrate W. With the aid of the interferometric displacement measuring means IF and the second positioning means, the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library. In general, movement of the object tables MT, WT can be realized with the aid of a long stroke module (course positioning) and a short stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash". Instead, the mask table NIT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The apparatus also includes a base frame BP (also referred to as a base plate or machine frame) to support the components of the apparatus, and a reference frame RF, mechanically isolated from the base frame BP to support the projection system PL and position sensors such as the interferometric displacement measuring means IF.

Figure 2:
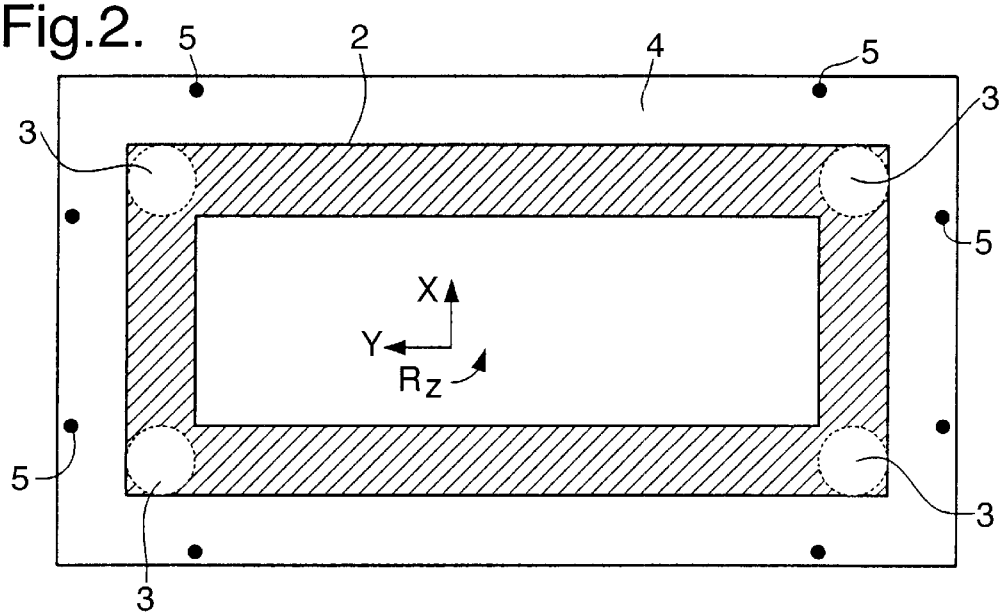
FIG. 2 is a plan view of a balance mass of the present invention in the substrate stage of the apparatus of FIG. 1.

FIG. 2 shows a balance system according to a first embodiment of the invention, which is used in a wafer stage comprising substrate table WT, of the lithographic apparatus to provide balancing in three degrees of freedom. The arrangement described below may also be used, with suitable modification, in a reticle stage, comprising mask table MT, of a lithographic apparatus.

The balancing system of the first embodiment comprises a balance frame 2 (balance mass) which is supported by substantially frictionless bearings 3 so as to be moveable over a guide surface 4 provided on the machine base frame. The frictionless bearings 3 may be aerostatic bearings or hydrostatic or magnetic bearings, for example. Alternatively, if the required range of movement is relatively small, elastic guiding systems such as flexures or parallel leaf springs can be used. The arrangement may also be reversed—i.e. the bearings provided in the machine frame and acting against a guide surface on the underside of the balance frame. The guide surface 4 is parallel to the XY plane defined for the apparatus and the balance frame 2 is free to translate in the X and Y directions and to rotate (Rz) about axes parallel to the Z direction.

Figure 3:
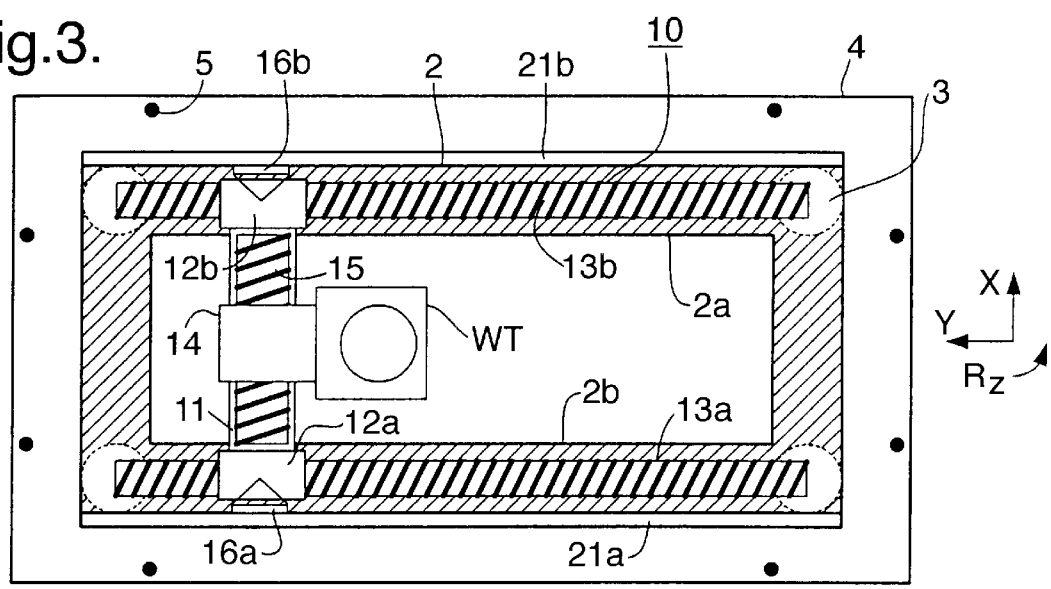
FIG. 3 is a view similar to FIG. 2 but additionally showing the drive arrangement for the substrate table.

The positioning system 10, shown in FIG. 3, is placed within or upon the balancing frame 2 and has relatively large ranges of movement in the X and Y directions. It is important that the center of mass of the positioning system 10 be as close as possible in the Z direction to the center of mass of the balance frame 2. In particular, it is preferred that the vertical separation of the two centers of mass is substantially less than 100 mm and ideally zero.

Elastic posts or buffers 5 limit the movement of the balance frame 2 to prevent it leaving the guide surface 4.

The positioning system is arranged such that the reaction forces acting in opposition to the drive forces exerted on the driven object are transmitted to the balance frame via mechanical or electromagnetic connections. These connections are positioned in or close to the XY plane containing the center of mass of the combined system of balance frame 2 and positioning system 10. The connections may, for example, be aerostatic bearings with bearing surfaces perpendicular to the XY plane or electromagnetic linear actuators with, for example, magnets attached to the balance frame 2 and coils or armatures attached to the positioning system, such that the line of action of the electromagnetic forces lies in the same XY plane as the combined center of mass.

FIG. 3 shows such an arrangement where the positioning system 10 is a so-called H-drive. The H-drive 10 comprises an X-beam 11 mounted at or near its ends to respective sliders 12a, 12b. Sliders 12a, 12b carry armatures of linear motors that act in concert with elongate magnet tracks 13a, 13b, which are mounted in the long sides 2a, 2b of rectangular balance frame 2, to translate X-beam 11 in the Y direction. The object to be positioned, in this case wafer table WT, is driven in the XY plane by a further slider 14 which is mounted on X-beam 11. Slider 14, similarly to sliders 12a, 12b, carries the armature of a linear motor to act against a magnet track 15 mounted in X-beam 11 to translate slider 14 along the X-beam and hence position wafer table WT in the X direction. Independent control of the positions of sliders 12a, 12b allows the angle between X-beam 11 and the balancing frame to be varied and hence the Rz (rotation about the Z axis) position of the wafer table WT to be controlled within a certain range to compensate for any yaw movements of the balancing frame. It will be appreciated that, for this reason and also due to distortion of the balance frame caused by shear components in the resultant force on the balance frame, the X and Y directions in which the drivers exert forces will not always be exactly orthogonal. By this arrangement, the reaction forces in the Y and Rz directions are transferred directly to the balance frame 2. Sliders 12a, 12b also carry air bearings 16a, 16b which act against upstanding walls 21a, 21b provided on the balance frame 2 to transmit reaction forces in the X direction to balance frame 2. Instead of a pair of thrust bearings 16a, 16b to transmit the X direction forces, a single pre-loaded beating or an opposed pad bearing, for example, may be used on one of the two sides and is often preferred as it avoids difficulties with cosine foreshortening when the X-beam 11 is not perpendicular to the balance frame 2.

As illustrated, the positioning system is supported in the Z direction and against Rx, Ry rotations by the balance frame. This function can also be performed by the guide surface 4 for the whole or a part of the positioning system (e.g. the wafer table WT), by a separate surface or surfaces fixed relative to the base frame, or by a combination of the above.

If so-called planar motors are used, reaction forces in the X and Y directions are transmitted to the balance frame via a magnet (or coil) plate in the XY plane. The magnet (or coil) plate may form part of the balance frame in the XY plane, and so desirably increase its mass to reduce its movement range. Again, the magnet (or coil) plate may be supported in Z, Rx and Ry directions by a second balance mass or by separate means, such as frictionless bearings, over the machine base.

The drive forces exerted on the driven object, in this case the wafer table WT, give rise to equal and opposite reaction forces which, according to the invention, are exerted on the balance frame (balance mass). From Newton's laws, it will be seen that the ratio of the displacements of the driven object and the balance mass is inversely proportional to their mass ratio, i.e.:

$$\frac{x_1(t)}{x_2(t)} = -\frac{m_2}{m_1} \qquad [1]$$

where $x_i$ is the displacement of mass i relative to the common center of gravity and $m_i$ is the mass of mass i. In this context it should be noted that the balance mass ratio may vary according to the direction in which displacement occurs. In the present embodiment, the X-beam 11 and Y-sliders 12a, 12b move with the wafer table WT for displacements in the Y direction whereas the wafer table moves relative to the X-beam 11 for displacements in the X-direction. Thus the driven mass for displacements in the Y-direction is the combined mass of the wafer table WT, X-slider 14, X-beam 11 and Y-sliders 12a, 12b. On the other hand, for displacements in the X-direction, the driven mass is only the mass of the wafer table WT and X-slider 14; the X-beam and Y-sliders instead form part of the balance mass. Since the X-beam and Y-sliders have a similar mass to the wafer table WT and X-slide 14, this can make a significant difference to the balance mass ratio.

By making the balance frame 5 to 20 times more massive than the combined moving mass of the positioning system, the motion ranges of the balance frame can be restrained and the overall footprint of the balancing system confined as desired.

If, during positioning, the center of mass of the balance frame is not in line with the center of mass of one of the positioning devices in the X or Y direction, reaction forces in that direction may cause yaw motion of the balance frame. In some cases, e.g. circular motion of the driven object around a point offset from the center of mass of the balance frame, yaw motions can be caused that cumulate over time rather than cancel. To prevent excessive yaw motion, a negative feedback servo system is provided. This control system is also adapted to correct long-term cumulative translations (drift) of the balance frame that might arise from such factors as: cabling to the positioning devices, misalignment of the positioning drives, minute friction in the bearings 3, etc. As an alternative to the active drift control system described below, a passive system, e.g. based on low-stiffness springs, may for example be used.

Figure 4:
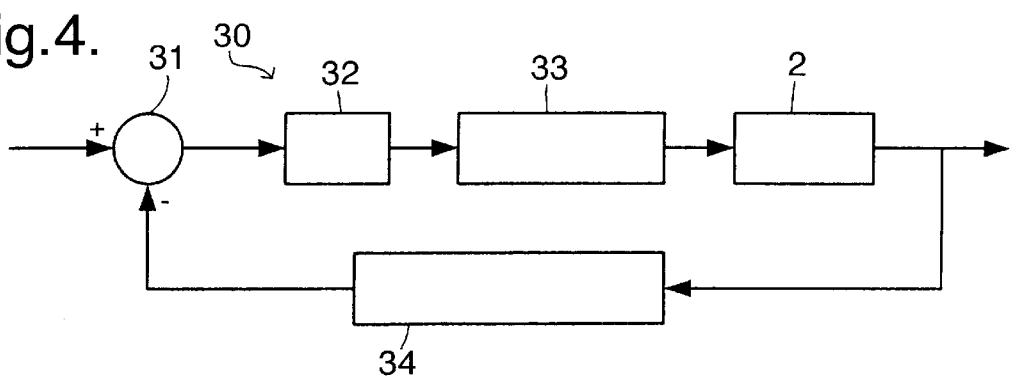
FIG. 4 is a diagram of the servo system of the balance system of FIG. 2.

FIG. 4 shows the control loop of a servo system 30 as referred to above. The X, Y and Rz setpoints of the balance mass with respect to the machine frame are supplied to the positive input of subtractor 31, whose output is passed to the servo controller 32. The servo controller controls a three-degree-of-freedom actuator system 33, which applies the necessary corrections to the balance frame 2. Feedback to the negative input of subtractor 31 is provided by one or more multiple-degree-of-freedom measurement systems 34 which measure the position of the balance frame and driven mass. The positions of both balance frame and driven mass may be measured relative to a fixed frame of reference. Alternatively, the position of one, e.g the balance mass, may be measured relative to the reference frame and the position of the driven mass measured relative to the balance mass. In the latter case the relative position data can be transformed to absolute position data either in software or by hardware.

The set points of the servo system 30 are determined so as to ensure that the combined center of mass of the positioning device(s) and balance frame 2 remains unchanged in the XY plane. This defines the condition:

$$m_1 \cdot \vec{u}_1(t) + m_2 \cdot \vec{u}_2(t) = m_1 \cdot \vec{u}_1(0) + m_2 \cdot \vec{u}_2(0) \quad [2]$$

where $\vec{u}_i(t)$ is the vector displacement of mass i in the X-Y plane at time t relative to a fixed reference point. The error signal between the calculated (using equation [2]) and measured positions is provided to the actuation system 33, which applies appropriate correction forces to the balance frame 2. The lowest resonance mode of the balancing frame and/or machine base is at least a factor of five higher than the servo bandwidth of the drift control system.

To minimize cumulative yaw motions of the balancing frame, the control mode is configured with a low servo bandwidth but a fixed setpoint (e.g. zero yaw). Similar to a passive (e.g. spring) drift control, the servo bandwidth for yaw serves as a low-pass filter to minimize transient moments on the machine base about the yaw axis. In other words, only reaction forces to correct long-term (low frequency) movements are transmitted to the base frame.

Figure 5:
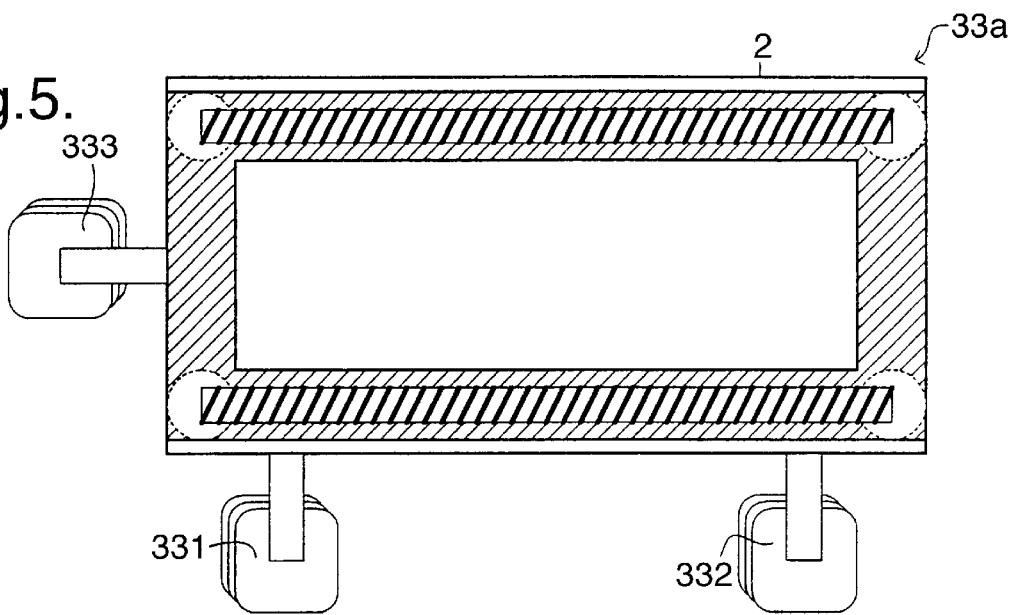
FIG. 5 is a plan view of the drift control arrangement of a first variation of the balance system of the first embodiment.

FIG. 5 shows a drift control actuation system 33a according to a first variation of the first embodiment. This system comprises three Lorentz(force)-type linear motors (e.g. voice coil motors, ironless multi-phase linear motors, etc.) 331, 332, 333. Two of these motors 331, 332 act in one direction, e.g. the X direction, and are spaced apart widely in the other, e.g. Y. The third motor 333 acts in the other direction, e.g. Y, and through or near to the combined center of mass of the balancing frame. The drivers are preferably Lorentz force motors having a magnet plate or coil elongate in the direction perpendicular to the direction in which they act so that they can exert a force in the given direction irrespective of the position of the balance frame 2 in the perpendicular direction.

Figure 6:
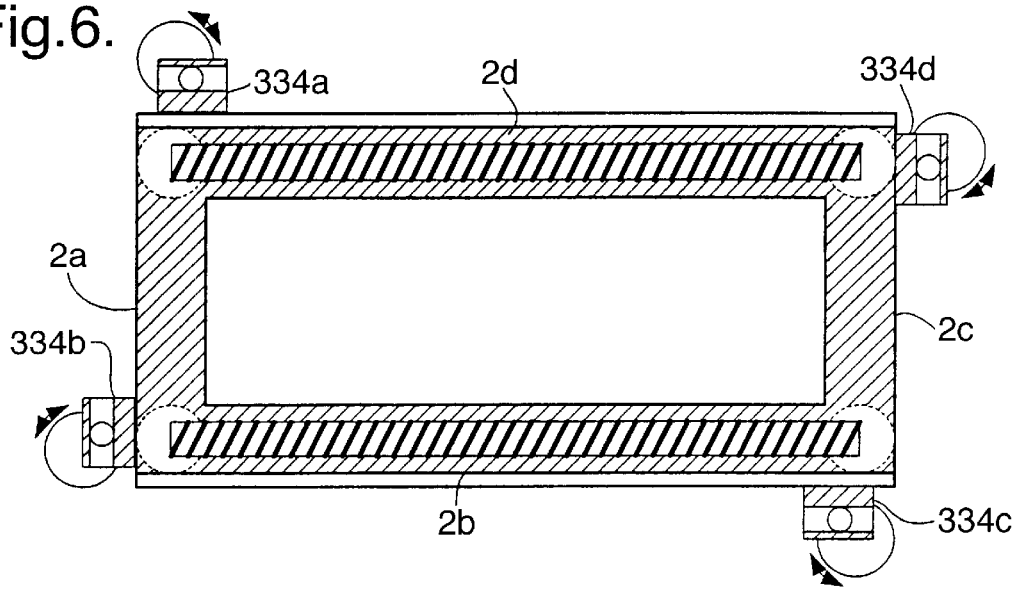
FIG. 6 is a plan view of the drift control arrangement of a second variation of the balance system of the first embodiment.

The above arrangement, using three drivers, is advantageous as being the simplest possible arrangement, but if the balance frame 2 is an open rectangle with limited resistance to shear, four motors may be used, each acting along or close to the neutral axis of one side member of the frame, thereby to minimize bending of the frame members. Such an arrangement is shown in FIG. 6. Here, four drivers 334a, 334b, 334c, 334d are used—one at each corner, arranged to exert force parallel to and in line with a respective one of the four beams 2a, 2b, 2c, 2d. Each of the four drivers can be, as before, Lorentz type linear motors. A further alternative is to use two planar motors, each exerting forces in the X and Y directions, to provide combined control in X, Y and $R_z$.

Figure 7:
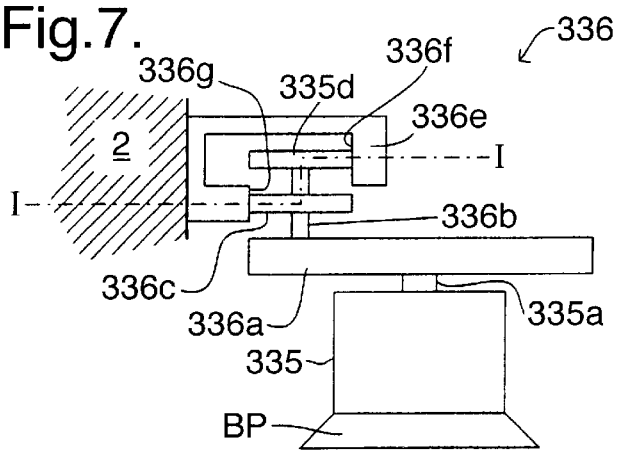
FIG. 7 is an enlarged side view of a driver of the drift control arrangement of FIG. 6.
Figure 8:
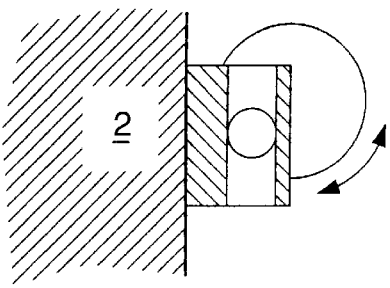
FIG. 8 is a cross-sectional view of the driver along line I—I of FIG. 7.

An alternative form of driver 334 is shown in FIG. 7, which is a side view, and FIG. 8, which is a sectional view along line I—I in FIG. 7. Driver 334 consists of a rotary Lorentz motor 335 (such as an ironless moving coil motor, a DC or AC brushless motor, etc.) mounted on the base or machine frame BP and connected to the balance frame 2 by a rotary-linear motion transformer 336. The rotary-linear motion transformer 336 comprises a disc 336a attached rigidly to the drive shaft 335a of the motor 335 and having an eccentrically mounted pin 336b. Pin 336b forms an axle for two wheels 336c, 336d which engage a coupling frame 336e mounted on the balance frame 2. Coupling frame 336e is elongate perpendicular to the direction of action of the force to be exerted on the balance frame and generally C-shaped in cross-section. It surrounds the wheels 336c, 336d so that each engages a respective one of opposed bearing surfaces 336g, 336f. Bearing surface 336f faces towards balance frame 2 and bearing surface 336g faces away. Thereby, if motor 335 is energized to rotate disc 336a clockwise in FIG. 8, wheel 336c will be caused to bear on surface 336g and exert a leftwards push force on balance frame 2. Similarly anticlockwise rotation of disc 336a would exert a pull force rightwards on balance frame 2.

Rotary-linear motion transformer 336 is arranged to be substantially friction free and reversible with no play so that drift actuation control can be carried out in a force mode rather than a position mode. The position of balance frame 2 can additionally be measured via rotary encoders (not shown) provided on disc 336a.

Figure 9:
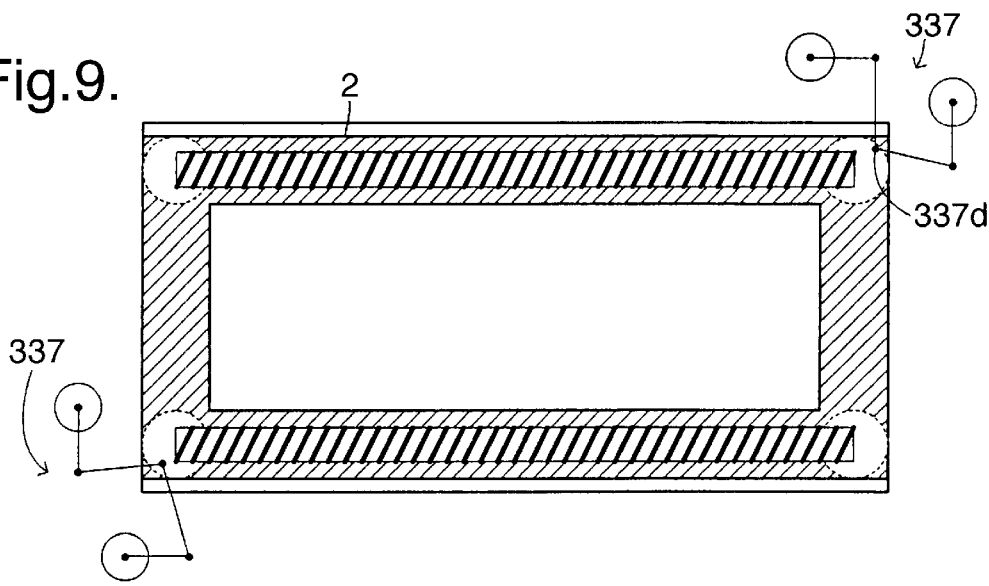
FIG. 9 is a plan view of the drift control arrangement of a third variation of the balance system of the first embodiment.
Figure 10:
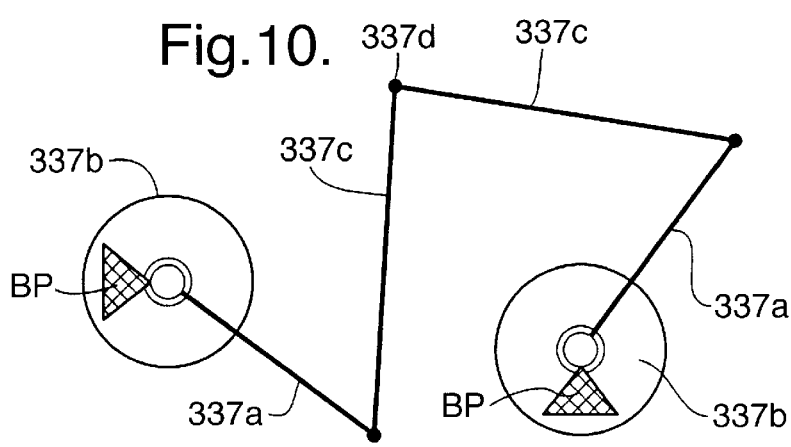
FIG. 10 is an enlarged plan view of a driver of the drift control arrangement of FIG. 9.

A further alternative drift control system is illustrated in FIG. 9, which is a plan view of the balance frame 2, and FIG. 10, which is an enlarged view of one of the drive mechanisms 337 used in this alternative. Drive mechanism 337 is a so-called "double scara mechanism" which consists of two crank-con'rod mechanisms connected to a common pivot point. Each crank-control mechanism consists of a crank 337a driven by a Lorentz-type torque motor 337b and a con'rod 337c connecting the end of crank 337a to common pivot point 337d. Torque motor 337b is mounted on the base frame BP and its drive shaft fixed against translation so that reaction forces are transferred to the base frame BP.

The drift actuation system of FIGS. 9 and 10 is overdetermined since only three drives are sufficient to control the balance frame in three degrees of freedom but the additional motor provides the same benefits as that of the arrangement of FIG. 6.

The position and orientation of the balance frame 2 can be determined from the crank angles, which may be measured by rotary encoders provided on the drive shafts of motors 337b. In the servo control system, two coordinate transforms are provided: one to convert information of the angular position of the cranks 337a to X, Y, Rz coordinates of the position of the balance mass 2; and one to convert the forces determined by the controller 33 into torques for the drive motors 337b.

As mentioned, the above-described drift control arrangements may include linear or rotary position sensors incorporated into the linear or rotary drive mechanisms. Alternatively an independent position measuring system, e.g. a grid encoder or a 2-dimensional position sensing detector, may be employed. Such a system may have multiple outputs which can be transformed into X, Y and Rz coordinates or may provide independent measurement of the XY positions of two points on the balancing frame, preferably diagonally opposite corners. Such a positioning mechanism may measure the position of the balance frame 2 relative to the base frame or, in ultra-precision machines, to a vibration-isolated metrology frame.

Figure 11:
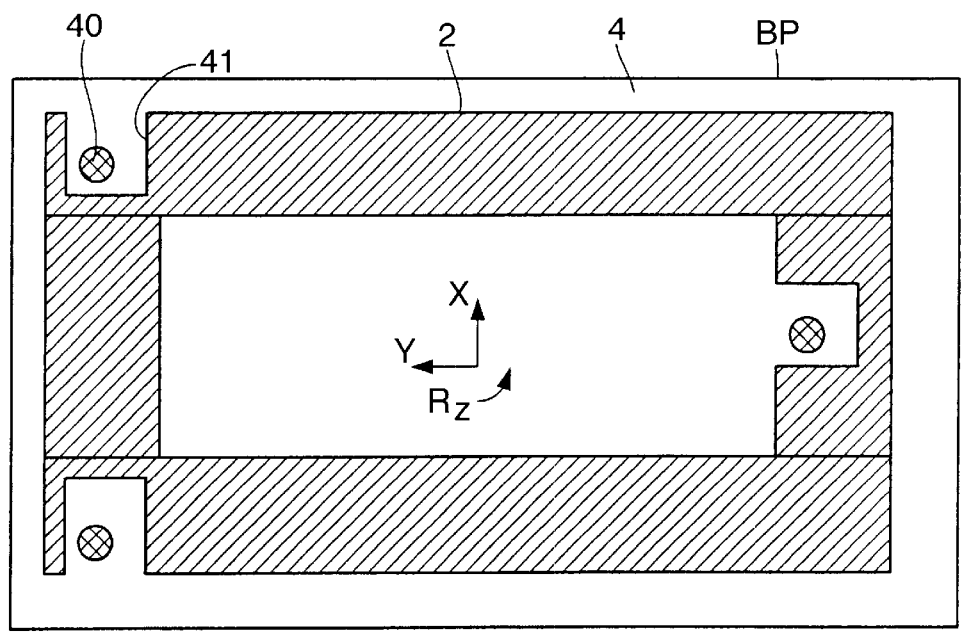
FIG. 11 is a plan view of a fourth variation of the first embodiment, showing stroke limiters.

To prevent the balance frame 2 from drifting out of range, e.g. in the event of an error situation, a stroke limiting device may be provided between the balancing frame and the base frame. An example of such a device is shown in FIG. 11 which is a view showing a cross-section through the lower part of the balancing frame 2. In this device, three pins 40 project upwardly from the bearing surface 4 of the base frame BP and engage open-ended slots 41 in the balance frame 2. The slots 41 and pins 40 are sized and arranged to confine movement of the balance frame 2 to a predefined envelope in X, Y and Rz. The pins 40 may be resilient or spring-loaded to cushion any shock to the balance frame 2 in the event of a crash. The stroke limiting device may be kinematically inverted, with pins projecting from the balance frame 2 engaging in slots on the base frame BP.

If it is not possible to arrange that the centers of mass of the positioning devices and the balance frame 2, as well as the driving forces of the various actuators, lie in the same XY plane, driving forces acting at the offset will cause tilting moments Tx, Ty, i.e. moments tending to rotate the balance frame 2 and the positioning devices around the X and Y axes. If the balance frame 2 is supported in the Z, Rx and Ry directions with relatively high stiffness, tilting moments Tx, Ty will be transmitted to the base frame BP and cause vibrations there. Also, although coarse positioning is usually only performed in the X, Y and Rz directions, fine positioning actuators included in substrate table WT for the moveable object are commonly capable of positioning in all six degrees of freedom. The reaction forces from motions of the fine positioning system in Z, Ry, Rx, as well as the other degrees of freedom, can also cause vibrations if transmitted to the base frame BP.

Accordingly, the balance frame 2 is supported in the Z, Rx and Ry directions with low stiffness supports, comprised in bearings 3. Such supports may be low-stiffness frictionless bearings or elastic or gas springs in combination with frictionless bearings. Large-gap air bearings may also be used. As with the use of passive components to control drift in X, Y and Rz directions, the spring constants are chosen so that the Eigen-frequency of the balance frame mass-spring system is substantially lower, e.g. by a factor of 5 to 10, than the lowest fundamental frequency of the motion of the positioning devices. Should the wafer table WT be supported in Z, Rx, Ry by the guiding surface 4 on the base frame rather than on the balance frame, the base frame member providing guiding surface 4 can be treated as a second balance mass for Z, Rx and Ry and be passively supported as described.

Embodiment 2

Figure 12:
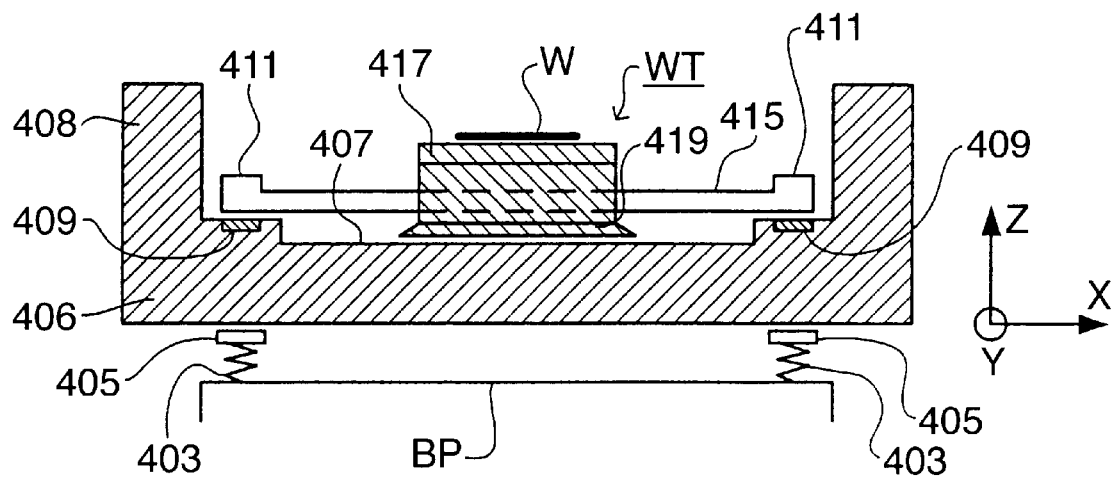
FIG. 12 is a cross-sectional view of a substrate stage of a second embodiment of the invention.

The substrate stage, comprising substrate table WT, of a second embodiment of the invention, which may be the same as the first embodiment save as described below, is shown in FIG. 12.

In the second embodiment, the balance mass 406 takes the form of an open box with a flat interior base 407, forming a guide surface for the wafer table WT, and upstanding side walls 408 serving to raise the center of gravity of the balance mass 406. The substrate table WT includes a fine positioning mechanism 417 operating in 6 degrees of freedom for the substrate W and a so-called air-foot forming a substantially frictionless bearing allowing the substrate table WT to be moved over the guide surface 407.

Movement of the substrate table WT is effected by the coarse positioning mechanism. This includes X-beam 415 relative to which the substrate table WT is driven by an X-driver (not shown) which has at its ends sliders 411 which include the translators of Y-direction linear motors to drive the X-beam, and hence the substrate table WT, in the Y direction and by applying different forces to the opposite ends of the X-beam in $R_z$. The stators 409 of the Y-direction linear motors are provided in shoulders of the balance mass 406. Y-direction and $R_z$ reaction forces from movement of the substrate table are thus directly applied to the balance mass 406. X-direction reaction forces are transferred to the balance mass 406 via bearings between the slides 411 and the sidewalls 408 of the balance mass 406.

Because the substrate table WT is guided over the base 407 of the balance mass 406, Z, $R_y$ and $R_x$ reaction forces from the corresponding movements of the substrate WT by the fine positioning mechanism 417, are also transmitted directly to the balance mass 406. Any tilting movements Tx, Ty arising from imperfect adjustment of the centers of gravity of the substrate table WT and balance mass 406 as well as the lines of force exerted by the X- and Y-drives, are also transmitted to the balance mass 406 via the air-pot 419 and the stiffness of the Y-linear motors.

To enable the balance mass 406 to absorb the reaction forces in all six degrees of freedom it must be free to move in all six degrees of freedom. This is achieved by supporting it from the base frame BP by a plurality of supports 403, which have a low stiffness in the Z direction, and substantially frictionless bearings 405, which bear on the lower surface of balance mass 405. The lower surface of balance mass 406 is flat, or has flat regions of sufficient size to accommodate the maximum expected or allowed range of movement of balance mass 406. Since the balance mass 406 is much, e.g. 5 to 10 times, heavier than the substrate table WT, the range of movement of the balance mass 406 will be much less than the range of movement of the substrate table WT.

Embodiment 3

Figure 13:
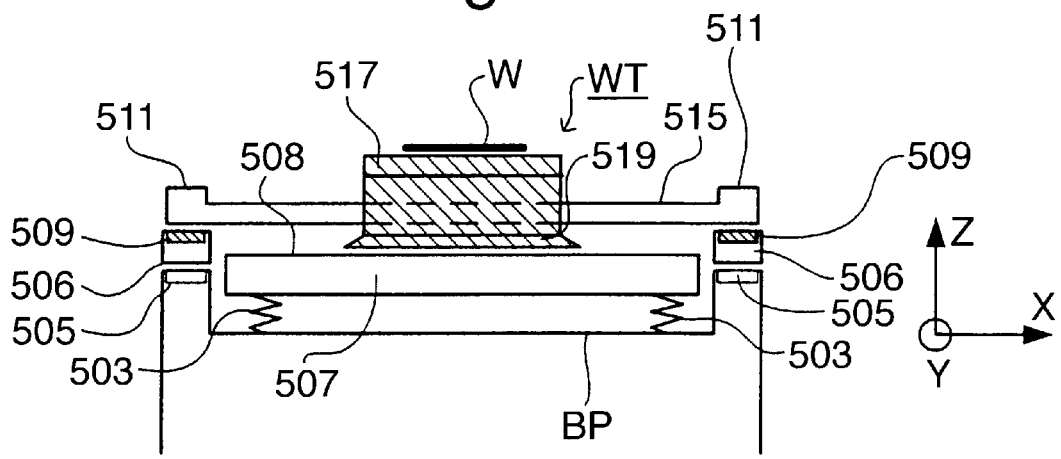
FIG. 13 is a cross-sectional view of a substrate stage of a third embodiment of the invention.

FIG. 13 depicts the substrate stage, comprising substrate table WT, of a third embodiment of the invention, which may be the same as the first or second embodiments described above.

In the third embodiment, the balance mass is divided into two parts 506, 507. The first balance mass part 506 comprises a rectangular frame surrounding the substrate table WT. Opposite sides of the first balance mass part 506 have mounted thereon the stator, e.g. the magnet track, of the Y-direction linear motors. The translators, e.g. coils, of the Y-direction linear motors, are mounted in sliders 511 at the ends of X-beam 515. The X-beam includes the stator of X-linear motor and the translator is mounted to the substrate table WT. Y- and $R_z$-reaction forces from the Y linear motor, which forms the coarse positioning mechanism together with the X-linear motor, are transmitted directly to the first balance mass part 506 and the X-reaction forces are transmitted via thrust bearings (not shown). To absorb the X- and Y-reaction forces, the first balance mass part 506 is supported by substantially frictionless bearings, eg. air bearings, 505 allowing it to move in X, Y and $R_z$.

Second balance mass part 507 takes the form of a plate and is disposed underneath the substrate table WT. Its upper surface 508 is flat and forms a guide surface over which the substrate table WT is borne by air foot 519. In this way, any reaction forces in Z, $R_x$ and $R_y$ from movements of the wafer W by fine positioning mechanism 517 are transmitted to second balance mass part 507, which is supported from the base frame BP by a plurality of supports 503 having a low stiffness in the Z-direction. These supports may be, for example, mechanical or gas springs.

Embodiment 4

Figure 14:
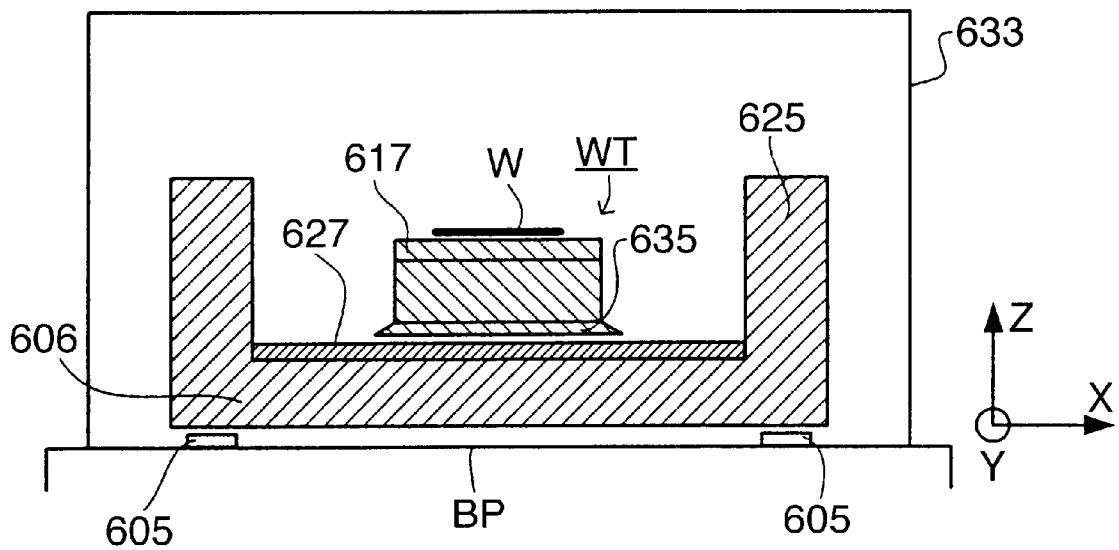
FIG. 14 is a cross-sectional view of a substrate stage of a fourth embodiment of the invention.

A fourth embodiment of the invention is a modification of the second embodiment for use in a vacuum. The substrate stage, including substrate table WT, is shown in FIG. 14.

As in the second embodiment, the balance 606 takes the form of an open box. In this embodiment, the base of the box includes the stator 627, e.g. magnet array, of a planar motor whose translator 635 is mounted to the wafer table WT. More information on a planar motor can be gleaned from U.S. Pat. No. 5,886,432, which is incorporated herein by reference. As before, upstanding walls 625 serve to raise the center of gravity of the balance mass 606 to the same horizontal plane as that of the substrate table WT. The planar motor 627, 635 may be arranged to levitate as well as translate the substrate table or additional bearings can be provided. Reaction forces from the X, Y and possibly, Rz translations of the planar motor are channeled to the balance mass 606.

Embodiment 5

Figure 15:
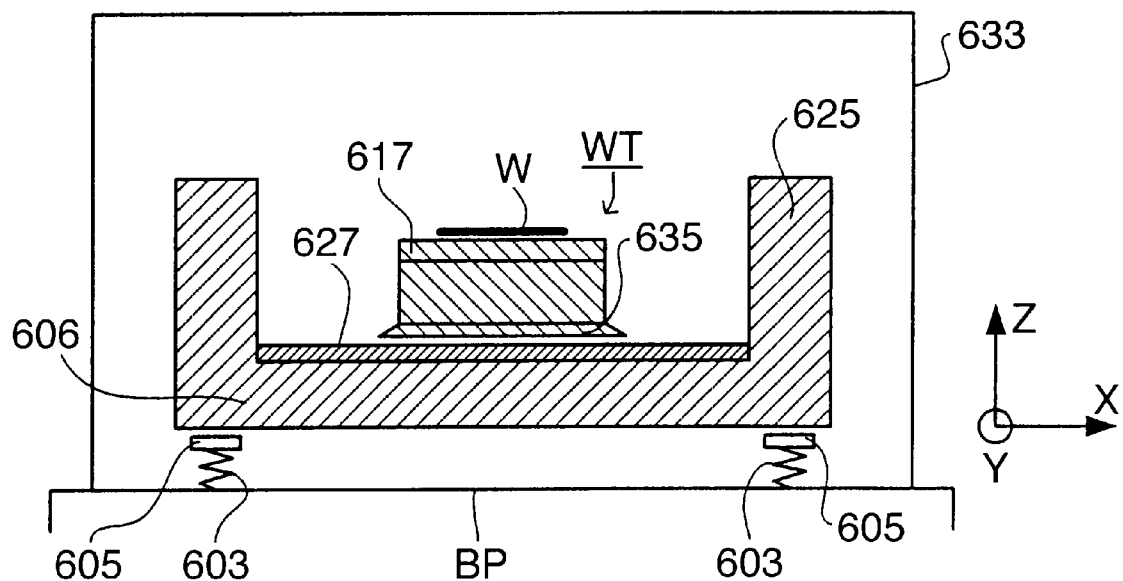
FIG. 15 is a cross-sectional view of a substrate stage of a fifth embodiment of the invention.

A fifth embodiment of the invention is a modification of the fourth embodiment as shown in FIG. 15. As in the fourth embodiment the substrate table WT is movable in the plane of the stator 627 of the planar motor (i.e. the X and Y direction). Reaction forces from the X, Y and $R_z$ movements of the coarse positioning mechanism planar motor) are transmitted directly to the balance mass 606. Reaction forces in all degrees of freedom for the fine position mechanism 617 are transmitted through the stiffness of the planar motor or additional bearings provided for the substrate table to the balance mass 606. The balance mass is mounted on bearings 605 and low-stiffness supports 603 in the same way as the second embodiment.

Whilst we have described above specific embodiments of the invention, it will be appreciated that the invention may be practiced otherwise than described. The description is not intended to limit the invention. In particular it will be appreciated that the invention may be used in the reticle or mask stage of a lithographic apparatus and in any other type of apparatus where fast and accurate positioning of an object in a plane is desirable.

What is claimed is:

1. A lithographic projection apparatus comprising:
   a projection beam illumination system which supplies a projection beam of radiation;
   a first object table which holds a projection beam patterning device which patterns the projection beam according to a desired pattern;
   a second object table which holds a substrate;
   a projection system which images the patterned beam onto a target portion of the substrate; and
   a balanced positioning system capable of positioning at least one of said object tables in more than three degrees of freedom, the positioning system comprising:
   at least one balance mass;
   a bearing which movably supports said balance mass;
   a coarse positioning actuator which positions said object table in at least two degrees of freedom, said two degrees of freedom including translation in first and second directions, said first and second directions being substantially mutually orthogonal; and
   a fine positioning actuator which positions said object table in at least a third degree of freedom substantially orthogonal to said first and second degrees of freedom, said coarse and fine positioning actuators being arranged so that reaction forces from said coarse and fine positioning actuators are channeled to said balance mass;
   wherein said balance mass is supported by said bearing so as to be substantially free to move in at least said third degree of freedom.

2. Apparatus according to claim 1 further comprising a base plate having a guide surface extending parallel to said first and second directions and wherein said bearing comprises a plurality of substantially frictionless bearings bearing on said guide surface and connected to said balance mass by supports having a low stiffness in said third direction.

3. Apparatus according to claim 2 wherein said bearings are selected from the group comprising aerostatic bearings, hydrostatic bearings and magnetic bearings.

4. Apparatus according to claim 2 wherein said supports are selected from the group comprising elastic springs and gas springs.

5. Apparatus according to claim 1 further comprising a base plate having a guide surface extending parallel to said first and second directions and wherein said bearing comprises a plurality of low-stiffness substantially frictionless bearings on said guide surface.

6. Apparatus according to claim 2 wherein said balance mass comprises a generally rectangular frame having its sides generally parallel to said first and second direction.

7. Apparatus according to claim 6 wherein said generally rectangular frame has a central opening and wherein said object table is at least partly disposed in said central opening.

8. Apparatus according to claim 7 wherein said object table has a low stiffness bearing for supporting said object table over said guide surface.

9. Apparatus according to claim 1 wherein said balance mass has a guide surface extending parallel to said first and second directions and said apparatus further comprises a base having substantially frictionless bearings bearing against said guide surface and supported from said base by supports having a low stiffness in said third direction.

10. Apparatus according to claim 9 wherein said balance mass has a further guide surface substantially parallel to said guide surface and said object table is provided with a substantially frictionless bearing bearing on said further guide surface.

11. Apparatus according to claim 10 wherein said coarse positioning actuator comprises a beam extending generally parallel to said first direction and a first driver which moves said object table relative to said beam in said first direction and second and third drivers connected to respective ends of said beam which drive said beam relative to said balance mass in said second direction.

12. Apparatus according to claim 10 wherein said coarse positioning actuator comprises a planar electric motor having a stator mounted to said further guide surface of said balance mass and a translator mounted to said object table.

13. The Apparatus according to claim 1,
wherein said balance mass comprises first and second balance mass parts, said first balance mass parts being moveable in said at least two degrees of freedom and said second balance mass part being moveable in at least said third degree of freedom.

14. Apparatus according to claim 13 further comprising:
a base;
wherein said first balance mass part comprises a generally rectangular frame surrounding said object table, said first balance mass part being supported from said base by substantially frictionless bearings and said coarse positioning actuator acting between said first balance mass part and said object table; and
said second balance mass part has a guide surface extending substantially parallel to said first and second directions and is supported from said base by supports having a low stiffness in said third direction, said object table being supported over said guide surface by a substantially frictionless bearing.

15. Apparatus according to claim 1 having more than one first object table and/or more than one second object table wherein reaction forces to drive forces for positioning a plurality of object tables are directed to a common balance mass or masses.

16. A lithographic projection apparatus comprising:
a projection beam illumination system which supplies a projection beam of radiation;
a first object table which holds a projection beam patterning device which patterns the projection beam according to a desired pattern;
a second object table which holds a substrate;
a projection system which images the patterned beam onto a target portion of the substrate; and
a balanced positioning system capable of positioning at least one of said object tables in at least three degrees of freedom, the positioning system comprising:
at least one balance mass;
a bearing which supports said balance mass so as to be substantially free to move in said three degrees of freedom; and
a driver which acts directly between said object table and said balance mass to position said object table in said three degrees of freedom;
said balance mass comprises a generally rectangular frame having its sides generally parallel to first and second substantially orthogonal directions, and a central opening in which said object table is at least partly disposed.

17. A lithographic projection apparatus comprising:
a projection beam illumination system which supplies a projection beam of radiation;
a first object table which holds a projection beam patterning device which patterns the projection beam according to a desired pattern;
a second object table which holds a substrate;
a projection system which images the patterned beam onto a target portion of the substrate; and
a balanced positioning system which positions at least one of said object tables in at least two degrees of freedom, the positioning system comprising:
at least one balance mass;
a bearing which movably supports said balance mass;
an actuator which positions said object table in at least first and second degrees of freedom, said first to second degrees of freedom being translations in first and second directions that are substantially orthogonal, said actuator comprising coarse and fine actuators and being arranged so that reaction forces from said actuator are channeled to said balance mass;
said coarse actuator comprising a planar electric motor having a translator mounted to said object table and a stator extending parallel to said first and second directions and mounted to said balance mass.

18. Apparatus according to claim 17, wherein said coarse actuator comprises a planar electric motor having a translator mounted to said object table and a stator extending parallel to said first and second directions and mounted to said balance mass.

19. Apparatus according to claim 17, having more than one first object table and/or more than one second object table wherein reaction forces to drive forces for positioning a plurality of object tables are directed to a common balance mass or masses.

20. Apparatus according to claim 17, wherein said balance mass comprises first and second balance mass parts, said first balance mass part being moveable in said first to third degrees of freedom and said second balance mass part being moveable in said fourth degree of freedom.

21. Apparatus according to claim 20, wherein said first balance mass part comprises a generally rectangular frame surrounding said object table, said first balance mass part being supported from a base by substantially frictionless bearings and said coarse positioning actuator acting between said first balance mass part and said object table; and
said second balance mass part has a guide surface extending substantially parallel to said first and second directions and is supported from said base by supports having a low stiffness in said third direction, said object table being supported over said guide surface by a substantially frictionless bearing.

22. Apparatus according to claim 17, wherein said balance mass comprises a generally rectangular frame having its sides generally parallel to said first and second direction and a central opening in which said object table is at least partly disposed.

23. Apparatus according to claim 17, having more than one first object table and/or more than one second object table wherein reaction forces to drive forces for positioning a plurality of object tables to a common balance mass or masses.

24. A method of manufacturing a device comprising:
providing a substrate provided with a radiation-sensitive layer to a first object table;
providing a projection beam of radiation using an illumination system;
patterning the projection beam with a pattern in its cross-section using a projection beam patterning device held on a second object table;

projecting the patterned beam of radiation onto target portions of said substrate;

moving, during or prior to said projecting step, at least one of said object tables coarsely in first to third degrees of freedom and finely in at least a fourth degree of freedom while reaction forces in said first to third degrees of freedom are exerted on a balance mass; and channeling reaction forces in said fourth degree of freedom to said balance mass.

25. The method according to claim 24, wherein moving at least one of said object tables coarsely is performed by a planar electric motor having a translator mounted to said at least one of said object tables and a stator extending parallel to said first and second directions and mounted to said balance mass.

26. The method according to claim 24, wherein said balance mass comprises first and second balance mass parts, said first balance mass part being moveable in said first to third degrees of freedom and said second balance mass part being moveable in said fourth degree of freedom.

27. The method according to claim 26, wherein said first balance mass part comprises a generally rectangular frame surrounding said object table, said first balance mass part being supported from a base by substantially frictionless bearings and said coarsely moving is performed by a coarse positioning actuator acting between said first balance mass part and said object table; and wherein said second balance mass part has a guide surface extending substantially parallel to said first and second directions and is supported from said base by supports having a low stiffness in said third direction, said object table being supported over said guide surface by a substantially frictionless bearing.

28. The method according to claim 24, wherein said balance mass comprises a generally rectangular frame having its sides generally parallel to said first and second direction and a central opening in which said object table is at least partly disposed.

29. The method according to claim 24, having more than one first object table and/or more than one second object table wherein reaction forces to drive forces for positioning a plurality of object tables are directed to a common balance mass or masses.

30. A device manufactured according to the method of claim 24.

* * * * *